United States Patent [19]

Piotrowski et al.

[11] Patent Number: 4,747,774

[45] Date of Patent: May 31, 1988

[54] CONFORMING CRUCIBLE/SUSCEPTOR SYSTEM FOR SILICON CRYSTAL GROWTH

[75] Inventors: Paul A. Piotrowski, Monroeville; Edgar L. Kochka, Greentree; Charles S. Duncan, Penn Hills, all of Pa.

[73] Assignee: Westinghouse Electric Corp., Pittsburgh, Pa.

[21] Appl. No.: 12,779

[22] Filed: Feb. 9, 1987

[51] Int. Cl.$^4$ ............................................. F27B 14/00
[52] U.S. Cl. .................................. 432/156; 432/157; 432/264; 432/265
[58] Field of Search ............... 432/262, 263, 264, 265, 432/156, 157, 158

[56] References Cited

U.S. PATENT DOCUMENTS

| | | | |
|---|---|---|---|
| 692,776 | 2/1902 | Auman | 432/157 |
| 1,013,838 | 1/1912 | Case | 432/158 |
| 1,081,535 | 12/1913 | Jeppson | 432/264 |
| 1,318,452 | 10/1919 | Keyes | 432/262 |
| 1,358,816 | 11/1920 | Bellis | 432/264 |
| 1,372,676 | 3/1921 | DeBats | 432/156 |
| 1,441,690 | 1/1923 | Lillibridge | 432/265 |
| 1,482,887 | 2/1924 | Collins | 432/264 |
| 1,612,916 | 1/1927 | Gorton | 432/263 |
| 1,720,327 | 7/1929 | Halvorson | 432/265 |
| 1,880,242 | 10/1932 | Dickson | 432/263 |
| 1,881,104 | 10/1932 | Tone | 432/265 |
| 2,195,436 | 4/1940 | Weller | 432/264 |
| 2,406,380 | 8/1946 | Johnston | 432/262 |
| 2,543,700 | 2/1951 | Leitten | 432/262 |
| 3,554,512 | 1/1971 | Elliott | 432/264 |

FOREIGN PATENT DOCUMENTS

| | | | |
|---|---|---|---|
| 658110 | 7/1965 | Belgium | 170/23 |
| 476891 | 10/1975 | U.S.S.R. | 171/23 |
| 616506 | 7/1978 | U.S.S.R. | 432/262 |

OTHER PUBLICATIONS

K. Keller, J. Konrad, W. Renkel, IBM Technical Disclosure Bulletin, vol. 19, No. 7, (Dec. 1976) p. 2590.

Primary Examiner—Henry C. Yuen

[57] ABSTRACT

A crucible/susceptor system is described in which the walls of the crucible and the susceptor cavity are sloped outward in an angle sufficient for the force of gravity to exceed the inward pulling forces created by the high surface tension of molten silicon allowing the softened quartz crucible walls to settle into and form to the sloped walls of the susceptor thereby improving heat transfer from the susceptor to the molten silicon and improving the reproducibility of the system.

3 Claims, 3 Drawing Sheets

CONFORMING CRUCIBLE/SUSCEPTOR SYSTEM FOR SILICON CRYSTAL GROWTH

FIELD OF THE INVENTION

The present invention relates to a crucible/susceptor system suitable for silicon crystal growth.

BACKGROUND OF THE INVENTION

Growth of crystal silicon ribbon, also known as silicon dendritic web, is currently established through use of a crucible/susceptor system, the crucible containing molten silicon from which the silicon ribbon is pulled. The present crucibles used in dendritic silicon web growth are much longer than they are wide and, in order to minimize convective flow, are shallow. They are made from thin-walled [0.080 in. (0.2 cm.)] semiconductor grade quartz. The crucibles typically are contained in a cavity in a molybdenum susceptor. Because control of the growth process is based upon subtle temperature changes, the quartz thickness of the crucible is held to a minimum to maximize the rate of heat transfer from the susceptor to the melt. This minimum thickness, however, presents the disadvantage of crucible wall collapse under operating conditions, impeding the heat transfer sought to be maximized.

Continuous growth of single crystal silicon ribbon requires that the silicon melt be replenished with silicon as the crystal is being pulled. Under ideal conditions, the replenishment is added at the hottest location of the melt; and the crystal is grown from the coolest location, which coincides with geometric center of the melt. Any region of the melt that is cooler than the location of the growing crystal may nucleate the freezing of the silicon and interfere with or terminate crystal growth. For this reason, it is important that heat transfer be uniform throughout the melt.

Post-run observations of cold charges show the inward collapse of crucible side walls, which interferes with uniform heat transfer to the melt. It was previously believed that crucible side wall collapse occurred during furnace cool down. However, an experiment was conducted with special slotted lids that showed that the crucible walls pulled inward during the melting of the silicon (at 1420° C., above the softening point of quartz). This is believed to be the combined result of high molten silicon surface tension forces acting on the softened quartz side walls and, once equilibrium has been disturbed, gravity.

The depth of the silicon melt, the height, thickness, and length of the unsupported crucible wall, and the forces of gravity and the surface tension of molten silicon acting on the wall at a temperature above the softening point of quartz determine the magnitude and direction of wall movement. The analysis of the bending of the crucible wall during web growth is in fact a complicated problem involving distributed forces, plastic flow, and creep.

FIG. 1 shows a sketch of a "collapsed" crucible as it would be presumed to appear at operating temperatures. The inward movement of the crucible side wall 10 would be greatest at the mid-point 10a of the longest unsupported span. Typically, this is in the middle of the long dimension of the crucible directly across from the growing web, and most likely, in an undercooled region of the melt.

When the side walls of the crucible are pulled inward and away from the susceptor heat source, not only does the transfer of heat to the upper regions of the melt become impeded, but the temperature at the inner face of the melt with the crucible side wall lowers and becomes a potential nucleation point for the formation of silicon "ice". A number of runs having poor crystal growth due to frequent "ice" formation appeared to also exhibit severe crucible collapse (post-run observation). The degree of crucible wall collapse is quite variable and influenced by the position of the crucible in the susceptor, the amount of silicon in the crucible, and the location of the crucible/susceptor interfaces relative to the location of the induction coil. Variable wall collapse will not give reproducible thermal conditions for crystal growth. It would, therefore, constitute an improvement over current crystal silicon ribbon growth technology to develop a crucible/susceptor system that would not exhibit severe crucible collapse.

SUMMARY OF THE INVENTION

The present invention provides a crucible/susceptor system for continuous growth of single crystal silicon ribbon in which all four walls of the crucible (and susceptor cavity) are sloped outward at an angle whereby the combined force of gravity and the hydrostatic forces of the molten silicon on the crucible walls are sufficient to exceed the inward-pulling forces created by the surface tension of molten silicon. Under these conditions, the softened quartz should settle into and conform to the sloped walls of the susceptor. Successful results have been achieved for typical crucible/susceptor systems having 0.080 inch thick crucible side walls, by sloping the four walls of the susceptor and crucible outwardly at an angle of 10° from the upright. This angle may vary depending on the thickness of the quartz crucible walls, being greater for thinner walls and less for thicker walls.

Other details, objects and advantages of the invention become apparent as the following description of the present preferred embodiments and the present preferred methods of practicing the same proceed.

BRIEF DESCRIPTION OF THE DRAWINGS

In the accompanying drawings, the preferred embodiments of the invention and preferred methods of practicing the invention are illustrated in which:

FIGS. 4a–d are more detailed views of the susceptor of the present invention, showing the sloped side walls.

DESCRIPTION OF THE PREFERRED EMBODIMENTS

After it was experimentally verified that the side walls of a silicon melt crucible pulled away from the side walls of the susceptor cavity at operating temperatures, a number of methods of reinforcing and/or supporting the side walls were considered. Heavier side walls were dismissed because they would further impede heat flow. Small reinforcing triangles joining the side walls to the base of the crucible were also considered, but proved difficult to fabricate and handle during fusion welding.

One possible solution involved fusing uniformly spaced quartz reinforcing rods (sealing cane) to the side wall of the crucible, perpendicular to and in contact with the base of the crucible. These reinforcing rods were helpful in retarding the inward movement of the crucible side walls, but did not completely eliminate post-run gaps between the crucible and the susceptor.

Another method employed involved extending the walls (or extensions thereof) of the crucible side walls into a slot machined into the lid that fits on the susceptor and covers part of the melt. Such wall extension was found to keep the walls upright, but did not eliminate the gap between the crucible and susceptor walls.

It was determined that it would be possible to solve the problem of crucible wall collapse by sloping the side walls of the crucible outwardly at an angle such that the inwardly-pulling surface tension forces of the liquid are counterbalanced by the gravitational and hydrostatic forces acting on the walls.

Figure 1A:
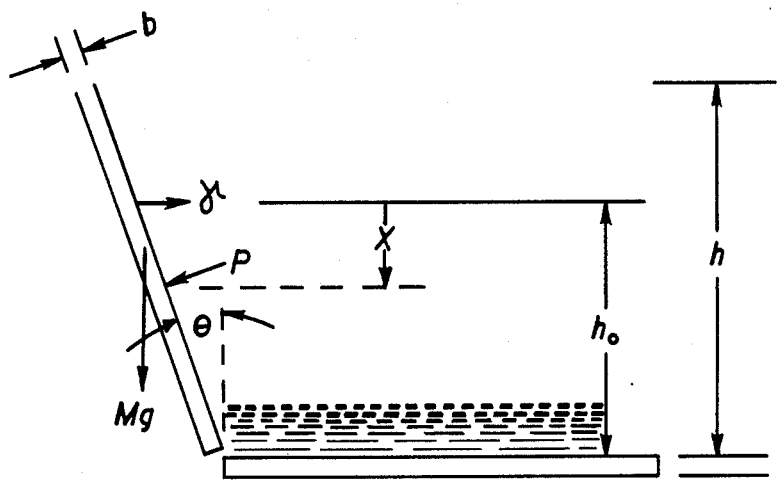
FIG. 1a represents the geometry considerations for crucible wall moment calculations.

Consider the crucible wall to be a stiff plate hinged to the crucible bottom as shown in FIG. 1a. The various forces acting on the wall are as shown in FIG. 1a, and the three acting moments arise from the surface tension of the liquid, $\gamma$, the weight of the crucible wall, Mg, and the hydrostatic pressure of the liquid silicon, $\rho$. Per unit length of wall:

Surface Tension:

$$L = -h_0 \gamma$$
$$= -720 \times 0.9$$
$$= -648 \text{ dyne-cm}$$

Weight of Crucible Wall:

$$m = \rho h b / \cos \theta$$
$$= .76 \text{ gm, at } \theta = 10°$$
$$L = \tfrac{1}{2} mgh \tan \theta$$
$$= 112 \text{ dyne-cm, at } \theta = 10°$$

Hydrostatic Pressure of Liquid Silicon:

$$L = \frac{\rho g}{\cos \theta} \int_0^{h_0} x(h_0 - x)\, dx$$
$$= \frac{\rho g h_0^3}{6 \cos \theta}$$
$$= 301 \text{ dyne-cm, at } \theta = 10°$$

If $\theta = 10°$, then the theoretical net moment is $-235$ dyne-cm, which indicates that the surface tension will pull the wall inward. In reality, test runs have shown an angle of 10° to be sufficient to counteract the inward-pulling effects of the surface tension. This is because the stiffness of the joint between the crucible wall and crucible bottom supplies some positive moment. For absolute stability, not requiring joint stiffness, a $\theta$ of about 30° would be required. In practice, a 10° slope has been adequate for crucible walls of 0.080 inch thick quartz. However, an optimum slope may exist between the 10 and 30 degree limits for crucibles that are not as thick in the joint area.

Figure 1:
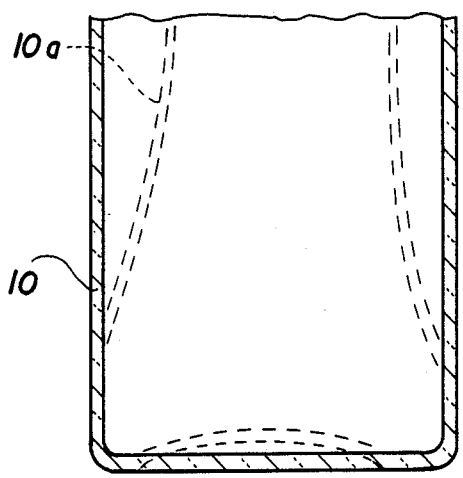
FIG. 1 is a schematic diagram showing the top view of a crucible, which represents an example of the standard crucible behavior showing the tendency of crucible side walls to collapse at operating temperature.
Figure 2:
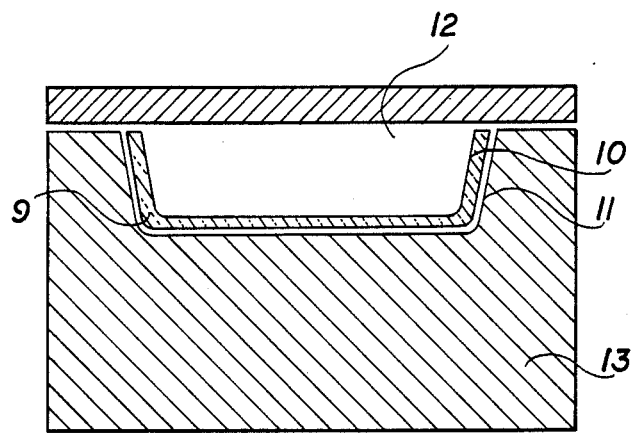
FIG. 2 is a cross-section of the present invention showing the susceptor and crucible with sloped side walls.

FIG. 2 shows a crucible 9 and susceptor 13 which comprise a preferred embodiment of the crucible/susceptor system described in this disclosure. As shown in FIG. 2, the crucible side walls 10 and side walls 11 of the susceptor cavity 12 are sloped in an outward direction. The crucible side walls 10 are sloped and shaped to fit within the contour of the susceptor cavity's sloped side walls 11. When the crucible/susceptor system reaches operating temperature, the quartz crucible side walls 10 soften. When the crucible and susceptor side walls are sloped outwardly, as opposed to being vertical, the hydrostatic pressure of the liquid silicon and gravitational forces acting on the crucible walls cause the softened quartz side walls 10 to relax and settle against the sloped susceptor side walls 11.

Figures 3A, 3B, 3C, 3D:
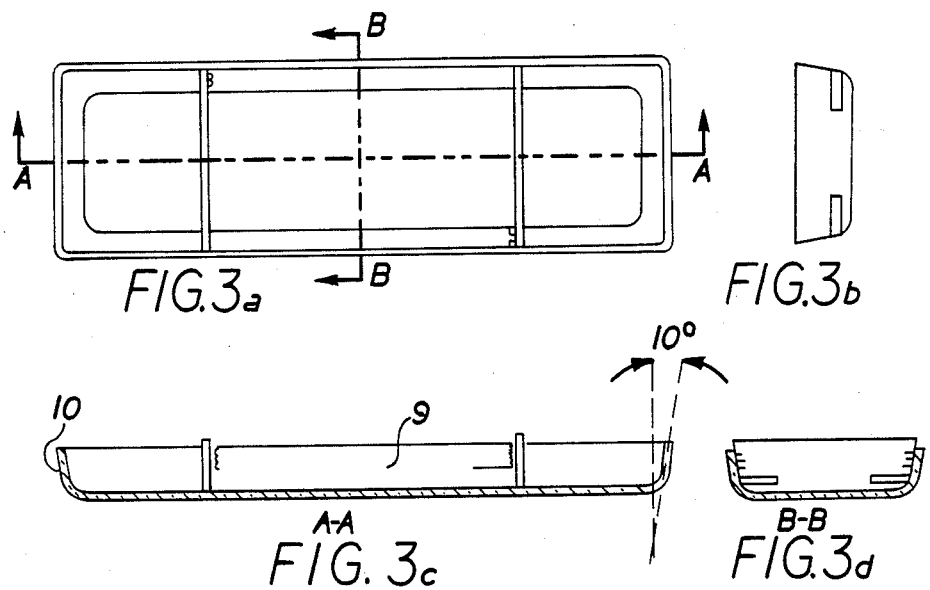
FIGS. 3a–d are more detailed drawings of the crucible used in the present invention, showing the sloped side walls.
Figure 4A:
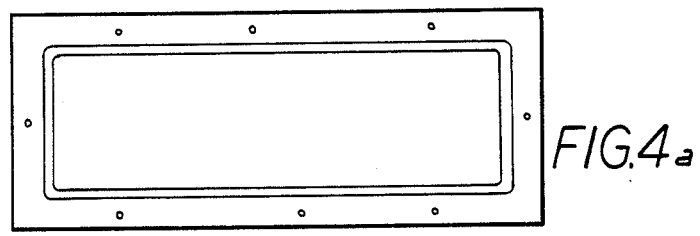
Figures 4B, 4C:
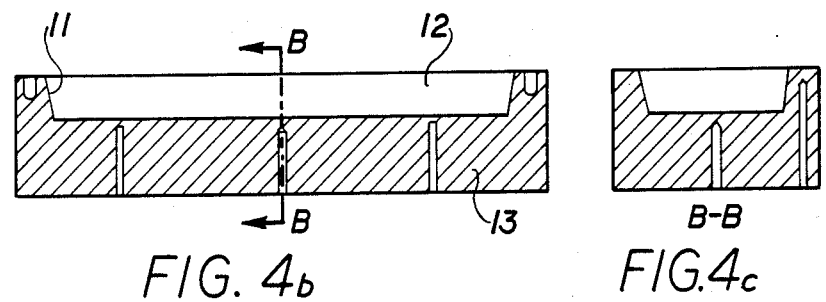

Successful results have been achieved employing a crucible 9 with all four side walls 10 sloped at an angle of 10° from the vertical, as shown in FIG. 3. FIG. 4 shows a susceptor 13 having side walls 11 sloped at an angle of 10° to be used in conjunction with the crucible shown in FIG. 3.

While presently preferred embodiments have been shown and described with particularity, it is distinctly understood that the invention may be otherwise variously performed within the scope of the following claims.

What is claimed is:

1. An apparatus for silicon dendritic web crystal growth, said apparatus capable of melting silicon to produce a silicon melt comprising:
    a. a susceptor having a cavity with continuously sloped side walls, said side walls having a substantially flat configuration and being sloped outwardly at an angle of 10° to 30° from the vertical such that the combined gravitational forces on the side walls and the hydrostatic forces of molten silicon in the cavity at the side walls exceeds the surface tension forces on such molten silicon;
    b. a heating means for melting said silicon;
    c. a thin-walled quartz crucible positioned in the cavity of the susceptor having continuously sloped side walls for preventing side wall collapse due to silicon surface tension, said side walls having a substantially flat configuration and sloped outwardly at an angle of 10° to 30° from the vertical such that the combined gravitational forces on the side walls and the hydrostatic forces of molten silicon in the cavity at the side walls exceeds the surface tension forces of the molten silicon, said side walls of said crucible conforming to and remaining substantially in contact with the side walls of the cavity of the susceptor upon softening of the crucible side walls at operating temperatures, said susceptor side walls supporting said crucible side walls when said side walls become soft.

2. An apparatus for silicon crystal growth as set forth in claim 1 wherein the side walls of the crucible are 0.080 inches thick.

3. An apparatus for silicon crystal growth set forth in claim 1 wherein the crucible side walls are 0.080 inches thick, and the crucible side walls and the susceptor side walls are sloped outwardly at an angle of 10° from the vertical.

* * * * *